United States Patent [19]
Parks et al.

[11] Patent Number: 5,745,124
[45] Date of Patent: Apr. 28, 1998

[54] METHOD AND SYSTEM FOR DATA TRANSLATION

[75] Inventors: Jay Scott Parks, League City; Christopher William Jacobs, Houston, both of Tex.

[73] Assignee: Texas Instruments Incorporated, Dallas, Tex.

[21] Appl. No.: 669,263

[22] Filed: Jun. 21, 1996

[51] Int. Cl.⁶ .................................................. G06F 15/00
[52] U.S. Cl. ................................................... 345/441
[58] Field of Search ................................ 345/440, 441, 345/443, 113, 115, 435

[56] References Cited

U.S. PATENT DOCUMENTS 5,553,214  9/1996  Marks et al. ..................... 345/441
5,619,632  4/1997  Lamping et al. ................... 395/141

*Primary Examiner*—Phu K. Nguyen
*Attorney, Agent, or Firm*—Robert L. Troike; Wade James Brady, III; Richard L. Donaldson

[57] ABSTRACT

This invention describes converting data representing wiring interconnect structures on an integrated circuit from traditional layout design databases which contain groups of unassociated geometries to object oriented databases which contain geometries with inherent connectivity information by reading all terminals (41), contacts (43), and unassociated geometries (45) and comparing (50, 54) end points of the geometric data with the pre-existing terminals and contacts initially read in. An internal terminal is created (52, 56) if no previously read-in terminal or contact exists.

4 Claims, 2 Drawing Sheets

FIG. 5

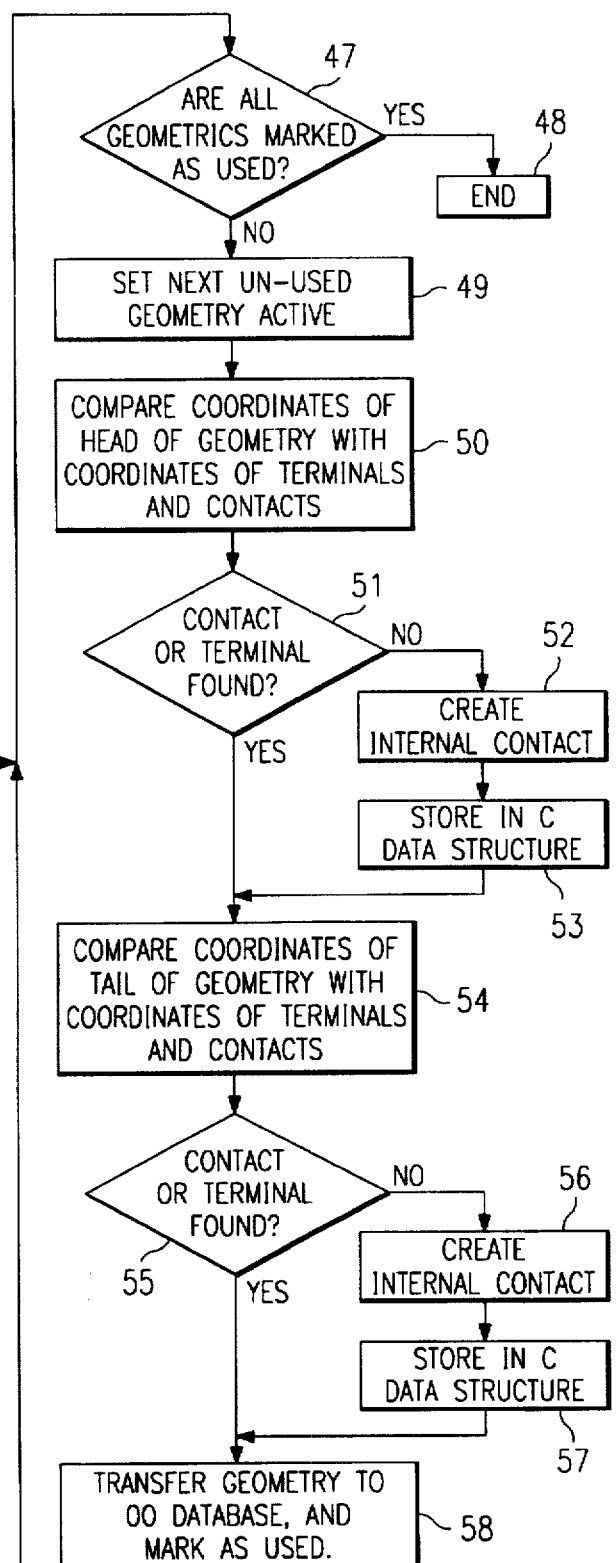

- 41 — READ IN ALL TERMINALS
- 42 — STORE IN C DATA STRUCTURE
- 43 — READ IN ALL CONTACTS
- 44 — STORE IN C DATA STRUCTURE
- 45 — READ IN UNASSOCIATED GEOMETRIC DATA (IE. ROUTING)
- 46 — STORE IN C DATA STRUCTURE
- 47 — ARE ALL GEOMETRICS MARKED AS USED? — YES → 48 END
- 49 — SET NEXT UN-USED GEOMETRY ACTIVE
- 50 — COMPARE COORDINATES OF HEAD OF GEOMETRY WITH COORDINATES OF TERMINALS AND CONTACTS
- 51 — CONTACT OR TERMINAL FOUND? — NO → 52 CREATE INTERNAL CONTACT → 53 STORE IN C DATA STRUCTURE
- 54 — COMPARE COORDINATES OF TAIL OF GEOMETRY WITH COORDINATES OF TERMINALS AND CONTACTS
- 55 — CONTACT OR TERMINAL FOUND? — NO → 56 CREATE INTERNAL CONTACT → 57 STORE IN C DATA STRUCTURE
- 58 — TRANSFER GEOMETRY TO OO DATABASE, AND MARK AS USED.

FIG. 6

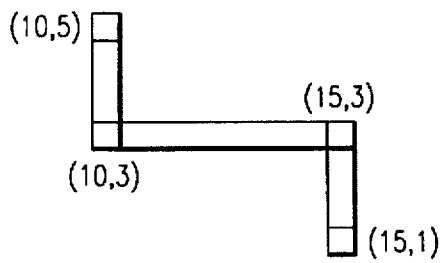

FIG. 7

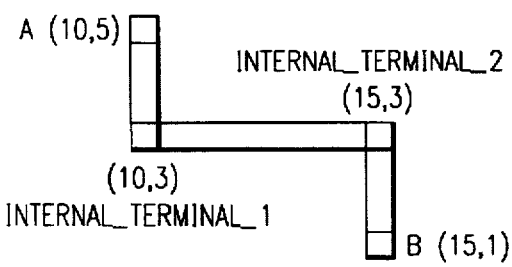

METHOD AND SYSTEM FOR DATA TRANSLATION

TECHNICAL FIELD OF THE INVENTION

This invention relates to data translation and more particularly to translating geometric data to object-oriented data.

BACKGROUND OF THE INVENTION

The introduction of new layout design tools which utilize an object-oriented database structure has posed a new problem to designers. Traditional layout design tools in the past have utilized databases which contain unassociated geometric data. When the data is taken as a whole, active transistors, contacts, wires, etc. are formed by the overlap and abutment of various layers of material.

Recently many design tools have adopted an object-oriented representation. This database representation has a distinct advantage over the traditional representation in that only user-defined objects which have the properties of certain layout structures, such as transistors, contacts, or wires, exist. Pure polygonal data can exist in an object-oriented database, but it cannot take advantage of the object-oriented capabilities.

For instance, in a traditional database a transistor is represented by a geometry of diffusion which is overlapped by a smaller geometry of polysilicon. To construct a transistor in a traditional design tool, the designer would first place a rectangular piece of N or P diffusion, then place a rectangular piece of polysilicon on top of the diffusion at the location where the active transistor is desired as shown in FIG. 1.

In an object-oriented database, a transistor is simply a transistor object. The design tool inherently knows what a transistor is and what materials make it up. The designer no longer needs to place two separate polygons of material, only a single object: a transistor.

Wires have a similar difference between the two database structures. In the traditional database, wires are represented as "random" geometries in which connectivity is determined by overlap and abutment as shown in FIG. 2. There is no inherent connectivity information present in the database. The data must be taken as a whole. A comparison of the numerous endpoints and edges of the polygons and rectangles will determine which geometries comprise electrical connections.

In an object-oriented database, "free" or unassociated rectangles or polygons do not contain inherent connectivity information. The head and tail of each wire must be connected to a terminal or contact object. Therefore, wires themselves are considered objects as shown in FIG. 3. In written expression:

TERMINAL head_object (1,3);

CONTACT tail_object (5,3);

WIRE head_object to tail_object.

Object-oriented database structures have a distinct advantage over the traditional database representation in that the connectivity of the routing/wiring is inherent. No comparison of the relative locations of the geometries is required to determine connectivity.

There has been little previous work on this topic. Software/Algorithms are available which provide a simple one-to-one conversion between database representations. The electrical connectivity still must be derived by a comparison of the edges of the various geometries. The inherent ability of the object-oriented database to hold connectivity information is not exploited.

SUMMARY OF THE INVENTION

In accordance with one embodiment of the present invention, a translation of electrical connectivity information from traditional layout design representation to object-oriented design representation is achieved wherein the connectivity information of the wiring is added to the object-oriented database. In accordance with one embodiment of the present invention, the method includes the step of reading locations of terminals and contacts and unassociated geometric data from geometric data. The geometric data also includes elements and locations of edges of the elements. The method includes the step of comparing the locations of the edges of the elements with the locations of the terminals and contacts read above.

IN THE DRAWINGS:

FIG. 5 is a flow chart for the operation of data translator according to one embodiment of the present invention;

FIG. 6 illustrates a simplified case of five terminals and the wiring geometries; and FIG. 7 illustrates how FIG. 6 would be represented in the translated object-oriented database.

DESCRIPTION OF ONE PREFERRED EMBODIMENT OF THE PRESENT INVENTION

In accordinance with present invention the unassociated/ free geometries are converted to object-oriented representation. Furthermore, electrical connectivity information is added to the database.

Figure 1:
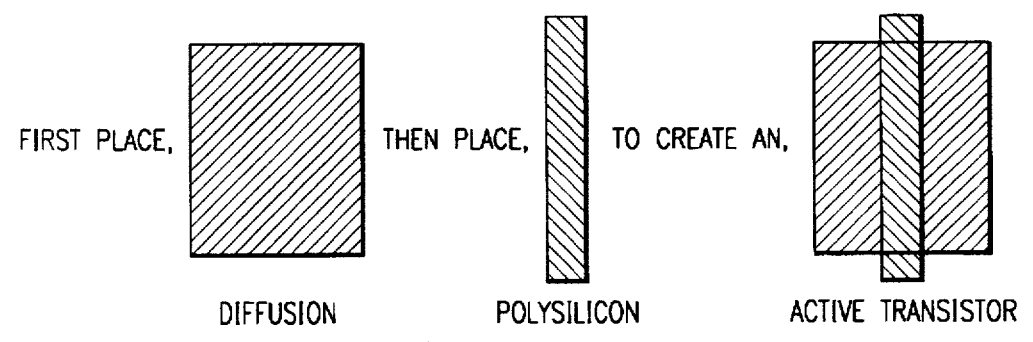
FIG. 1 illustrates a traditional database for a transistor.
Figure 2:
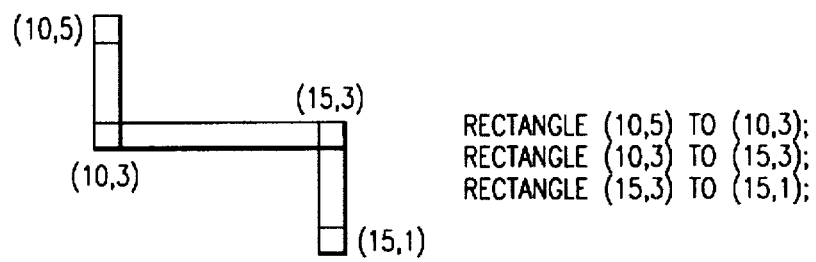
FIG. 2 illustrates a traditional database for wires.
Figure 3:
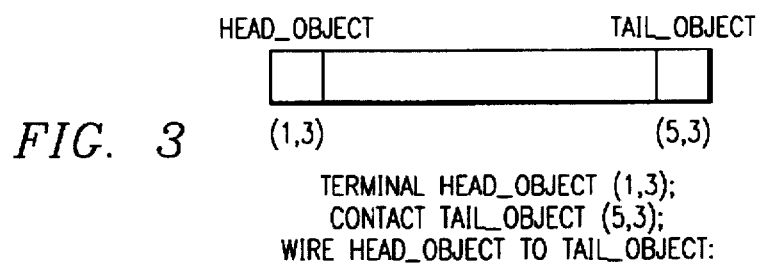
FIG. 3 illustrates an object-oriented database for a wire.
Figure 4:
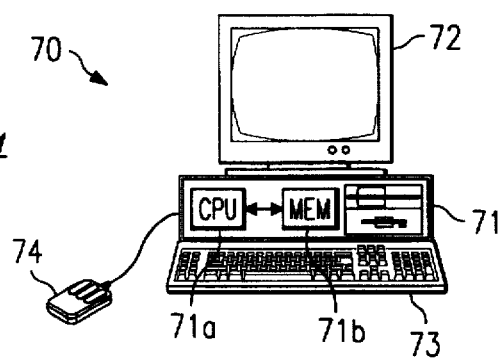
FIG. 4 illustrates a system programmed to operate according to the flow chart of FIG. 5.

Referring to FIG. 4 the translator 70 may be a general purpose computer with a processor section 71, a display 72, a keyboard 73 input, and a mouse 74 input. The processor section 71 would include a microprocessor 71a and a memory 71b. The memory stores the data in this case in a C language data structure. The processor operates according to the flow chart of FIG. 5 and generates the store information in an object-oriented format as discussed previously. The system can also be a dedicated translator made up of memory, a processor and a comparator to perform the steps discussed above. The process (step 41 in FIG. 5) first reads in all the terminals present in a large VLSI design. These terminals include the connection points to the physical package and the I/O terminals present on the various modules internal to the chip. Several attributes of the terminals are read into memory 71b; the most important of which is the physical locations of the terminals in the design. This information is stored (step 42) in the following C data structure.

```
typedef struct term_info{ /*Terminals */
        char ob[MAXTEXT], pnam[MAXSNAM];
        char lnam[MAXTEXT];
        char inst[MAXTEXT], type[10], side[2];
        byte used;
        float x1, y1, x2, y2;
        float w, cx, cy;
} term_def;
```

All of the contacts (step 43) are also read into the program in a similar manner. Several attributes are stored concurrently in the data structures listed below (step 44). These terminals and contacts will become the heads and tails of the numerous wires which make the routing of the design.

```
typedef struct cont_info{ /* Contacts */
    char ob[MAXTEXT], inst[MAXSNAM];
    int orient;
    float x, y;
} cont_def;
typedef struct mcont_info{ /*Matrix Contacts*/
    char ob[MAXTEXT], inst[MAXSNAM];
    float x, y, dx, dy;
    int ncx, ncy, orient;
}mcont_def;
```

Finally the large amount of unassociated geometric data which represents the routing of the chip is read (step 45) into the program. In order to extrapolate the connectivity information, all of the geometric figures must be read in at once. This required the creation of a series of large C data structures:

```
typedef struct path_range{ /*CLF Paths*/
    byte used;
    char lnam[MAXTEXT];
    char snam[MAXSNAM];
    int np;
    float w, *points;
} path_list;
typedef struct rect_range{ /*Rectangles*/
    byte used;
    char lnam[MAXTEXT];
    char snam[MAXSNAM];
    float w, x1, y1, x2, y2;
} rec_list;
```

After this data is present in memory (step 46), a thorough comparison of the endpoints is performed (step 47). The endpoints of the random geometries are compared against the pre-existing terminals and contacts which were read in initially. If no pre-existing terminals or contacts can be found for a given endpoint of a wire, it is assumed that this wire made a connection in the traditional database through overlap of or abutment to another geometry.

In an object-oriented database, wires are defined by two endpoints:

WIRE head_object TO tail_object;

"Head" and "tail" must either be a contact or terminal object. Therefore in order to transfer a given wire geometry from a traditional database to an object-oriented database, all wires must have a head and a tail. Connectivity no longer can be assumed by overlap or abutment. When all geometries are not identified or marked as used (step 47) the next unused geometry is made active and first the coordinates of the head of geometry is compared (50) with coordinates of terminals and contracts. If a terminal or contract is found (51), the coordinates of tail of geometry is compared with the coordinates of the terminals and contracts (step 54).

Where an endpoint of a geometry does not correspond to a contact or terminal ("no" in steps 51 and 55), an internal terminal is created (steps 52 and 56) and placed at that location to act as the endpoint and gives that wire something to connect to. This internal terminal is added to the terminal data structure (steps 53 and 57) and therefore is included in future terminal search iterations.

As the process continues, it will encounter the geometry which connected to the original geometry by overlap or abutment. The endpoint for this new geometry will be identical to the internal terminal which was created for the original geometry. When the process traverses the terminal data structure, a terminal match will be found with the internal terminal. Since this terminal has been created, it gives a physical object for the wire to connect to. This is how connectivity information which was not present in the traditional database is added to the object-oriented database.

When a head and tail of a given geometry is found, it is marked as "used" (step 58) and is removed from future searching iterations. When all geometries are marked as "used" the algorithm terminates (step 48).

For example, consider the simplified case of two terminals (A and B) and three wire geometries (1, 2, and 3) of FIG. 6.

Terminal List:

A: (10,5)
B: (15,1)

Wire Geometry List (endpoints):

1: (10,5) and (10,3)
2: (10,3) and (15,3)
3: (15,3) and (15,1)

The process will first read in the physical locations of the terminals (and contacts, which there are none in this design). The location of the endpoints of the geometries are then read into the program. All of this information is stored in the above data structures (steps 41–46).

The process sequentially works throughout all wire geometries studying the endpoints. In this case, the first geometry with (10,5) and (10,3) as endpoints is considered.

The first endpoint is compared against the list of pre-existing terminals (step 50). A match is found with terminal A (step 51). The other endpoint is also compared against the list of terminals (step 54). No match is found (step 55). Therefore, an internal terminal is placed at that location, (10,3) (step 56). Furthermore, the location of that terminal is added to the terminal list (step 57). Also since a head and tail for this geometry was found, it is marked as "used" (step 58).

The status of the terminal and wire geometry list is now:

Terminal List:

A: (10,5)
B: (15,1)
(10,3)

Wire Geometry List (endpoints):

1: (10,5) and (10,3) USED
2: (10,3) and (15,3)
3: (15,3) and (15,1)

Wire geometry #2 is then considered. The first endpoint (10,3) is compared to the terminal list. A match is found with the internal terminal that was created during the previous iteration. The second endpoint is not found in the list and therefore an internal is placed at (15,3). This terminal is placed in the terminal list and the geometry is marked as used.

The status of the terminal and wire geometry list is now:

Terminal List:

A: (10,5)
B: (15,1)
(10,3)
(15,3)

Wire Geometry List (endpoints):

1: (10,5) and (10,3) USED
2: (10,3) and (15,3) USED
3: (15,3) and (15,1)

The third geometry is then considered. A match is found for both endpoints, one with pre-existing terminals and a another with a recently defined internal terminal. This geometry is then marked as used. Since all geometries are marked as used, the process terminates. The following is how this example would be represented in and object-oriented database:

```
WIRE A TO internal_terminal_1;
WIRE internal_terminal_1 TO internal_terminal_2;
    WIRE internal_terminal_2 TO B;
```

FIG. 7 illustrates this representation. One can see that the three wire objects that make up this piece of routing are inherently connected. In a traditional database, the only way one knew that terminal A and wire 1 were connected was by a comparison of the endpoints. Now in the object-oriented representation wire 1's head is terminal A. In other words, terminal A defines wire 1, without terminal A, wire 1 can not exist.

By studying the group of wire statements in the object-oriented database, electrical connectivity of terminals A and B can be ascertained. A netlist can be extracted, and it would be seen that terminal A and terminal B are, electrically, one node.

Although the present invention and its advantages have been described in detail, it should be understood that various changes, substitutions and alterations can be made herein without departing from the spirit and scope of the invention as defined by the appended claims.

What is claimed is:

1. A method of translating geometric data where said geometric data includes elements and locations of edges of the elements to object-oriented data comprising the steps of:

reading all terminal locations from said geometric data and reading all contact locations from said geometric data;

reading unassociated geometric data;

comparing the location of the edges of the elements of said geometric data with the locations of the terminals and contacts as read from said geometric data;

for each element of the geometric data creating an internal terminal in an object-oriented data structure when an endpoint of said object-oriented data does not correspond to locations of the terminals and contacts as read from said geometric data; and repeating said creation step until endpoints are found.

2. A method of translating geometric data from a geometric data base where said geometric data base includes elements and locations of edges of the elements to an object-oriented data base comprising the steps of:

reading all terminals from said geometric data base;

storing attributes of said terminals including physical locations of said terminals in a data structure;

reading all contacts from said geometric data base;

storing attributes in said data structure including physical locations of said contacts in a data structure;

reading unassociated geometric data from said geometric data base;

storing said unassociated geometric data;

comparing the location of the edges of the elements of said geometric data with the locations of the terminals and contacts as read from said geometric data base;

for each element of the geometric data creating an internal terminal in said object-oriented data structure when an endpoint of said object-oriented data does not correspond to locations of the terminals and contacts as read from said geometric data base; and repeating said creation step until both endpoints are found.

3. A method of translating layout of an integrated circuit in a geometric data base with elements and locations of edges of said elements to an object-oriented data structure comprising the steps of:

reading all terminals on the integrated circuit in said geometric data base;

storing attributes of said terminals including physical locations of said terminals in a data structure;

reading all contacts on said integrated circuit in said geometric data base;

storing attributes of said contracts including physical locations of said contacts in said data structure;

reading unassociated geometric data of objects in said geometric data base including edges of the elements;

storing said unassociated geometric data in said data structure;

comparing the locations of the edges of the elements of said geometric data with the locations of said terminals and contacts as read from said in said geometric data base;

for each element of the geometric data creating an internal terminal in said object-oriented data structure when an endpoint of said object-oriented data structure does not correspond to a contact or terminal as read from the geometric data base;

repeating said creation step until both endpoints of all objects are found; and storing in said object-oriented database said geometric data with one endpoint being the head object and the other endpoint being the tail object for each object.

4. A translator for translating a layout of an integrated circuit in a geometric data structure to object-oriented data structure where said geometric data structure includes elements and locations of the edges of the elements, comprising:

a memory for storing said geometric data structure and said object-oriented data structure;

a processor coupled to said memory for reading all terminals on said integrated circuit in said geometric data structure and for storing attributes of said terminals including physical locations of said terminals in said memory;

said processor coupled to said memory for reading all contacts on said integrated circuit in said geometric data structure and storing attributes in said data structure including physical locations of said contacts in said memory;

said processor coupled to said memory for reading unassociated geometric data of objects in said integrated circuit and storing said unassociated geometric data in said memory;

said processor coupled to said memory and responsive to physical locations of said terminals and contacts and said unassociated geometric data for comparing the locations of the edges of the elements of said geometric data with the locations of said terminals and contacts as read in and stored in said memory; for creating for each element of the geometric data an internal terminal in said object-oriented data structure when an endpoint of said object-oriented data does not correspond to said location of said terminals and contacts as read from said geometric data base; for repeating said creation step until both endpoints of all objects are found; and for storing in said object-oriented database said geometric data with one endpoint being the head and the other endpoint being the tail for each object.

* * * * *